United States Patent [19]
Mimasaka et al.

[11] Patent Number: 6,076,979
[45] Date of Patent: Jun. 20, 2000

[54] METHOD OF AND APPARATUS FOR SUPPLYING DEVELOPING SOLUTION ONTO SUBSTRATE

[75] Inventors: Masahiro Mimasaka; Akiko Tanaka; Yukihiro Takamura, all of Kyoto, Japan

[73] Assignee: Dainippon Screen Mfg. Co., Ltd., Japan

[21] Appl. No.: 09/121,881

[22] Filed: Jul. 24, 1998

[30] Foreign Application Priority Data

Jul. 25, 1997 [JP] Japan .................................. 9-200084
Aug. 11, 1997 [JP] Japan .................................. 9-216372

[51] Int. Cl.⁷ ...................................................... G03D 5/00
[52] U.S. Cl. ........................ 396/604; 396/611; 396/627; 118/52
[58] Field of Search ................................... 396/604, 611, 396/627; 118/52, 677; 239/119

[56] References Cited

U.S. PATENT DOCUMENTS

| | | | |
|---|---|---|---|
| 5,392,989 | 2/1995 | Hurtig | 239/119 |
| 5,489,337 | 2/1996 | Nomura et al. | 118/677 |

FOREIGN PATENT DOCUMENTS

| | | | |
|---|---|---|---|
| 2-141759 | 5/1990 | Japan | 396/FOR 935 |
| 5-96222 | 4/1993 | Japan | 396/FOR 935 |
| 6-163386 | 6/1994 | Japan | 396/FOR 935 |
| 7-36194 | 2/1995 | Japan | 396/FOR 935 |
| 9-232221 | 9/1997 | Japan | 396/FOR 935 |
| 10-99764 | 4/1998 | Japan | 396/FOR 935 |
| 10-189419 | 7/1998 | Japan | 396/FOR 935 |

*Primary Examiner*—D. Rutledge
*Attorney, Agent, or Firm*—Ostrolenk, Faber, Gerb & Soffen, LLP

[57] ABSTRACT

A developing solution dispensing nozzle starts scanning at a scanning start position P1. After the developing solution dispensing nozzle reaches an edge of a substrate, the developing solution dispensing nozzle scans over the substrate while uniformly dispensing a developing solution to a surface of the substrate. The developing solution dispensing nozzle thereafter moves off the substrate from the other edge of the substrate. To uniformly supply the developing solution to a substrate, where a flow rate of the developing solution is set constant, a scanning speed is set large during an initial scanning section over a substrate, and the scanning speed is set slow during the remaining section. Meanwhile, where the scanning speed of the developing solution dispensing nozzle is set constant, the flow rate of the developing solution is gradually increased during the initial scanning section, and the flow rate is set constant during the remaining section.

16 Claims, 14 Drawing Sheets

F I G. 4
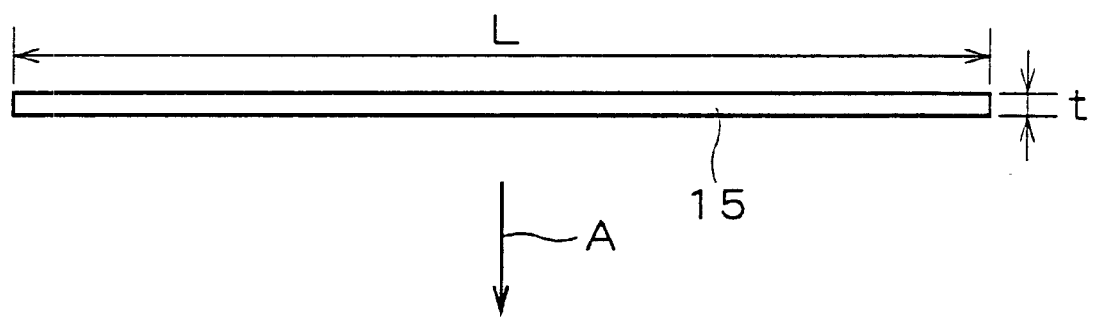

TO DRAIN

METHOD OF AND APPARATUS FOR
SUPPLYING DEVELOPING SOLUTION
ONTO SUBSTRATE

BACKGROUND OF THE INVENTION

1. Field of the Invention

The present invention relates to a method of and an apparatus for supplying a developing solution onto a photosensitive film which is formed on a substrate and developing processing is performed.

2. Description of the Background Art

A developing apparatus is used to develop a photosensitive film which is formed on a substrate such as a semiconductor wafer, a glass substrate for liquid crystal device, a glass substrate for photomask and an optical disk.

For example, a developing apparatus of spin type comprises a spin/hold portion for holding a substrate horizontally and rotating the substrate about a vertical axis, and a developing solution dispensing nozzle for supplying a developing solution to a surface of the substrate. The developing solution dispensing nozzle is attached to a tip end of a nozzle arm which is disposed for free rotation within a horizontal plane, and can move between an upper position above the substrate and a standby position.

During developing processing, after the developing solution dispensing nozzle moves to a position above the substrate from the standby position, a developing solution is supplied onto the photosensitive film which is formed on the substrate. As the substrate is rotated, the developing solution which is supplied spreads out over the entire surface of the substrate and contacts the photosensitive film. The substrate, as it holds the developing solution thereon (i.e., with the developing solution built up on the substrate) due to the surface tension of the developing solution, is kept still for a certain period of time, whereby the photosensitive film is developed. After the supply of the developing solution is completed, as the nozzle arm revolves, the developing solution dispensing nozzle moves to the standby position from the position above the substrate.

If the developing solution in the vicinity of an dispensing opening of the developing solution dispensing nozzle is exposed to air, the concentration of the developing solution changes because of the evaporation of the moisture contained in the developing solution and the properties of the developing solution change because of the contact of the developing solution with air. Hence, before the developing processing, the developing solution near the dispensing opening of the developing solution dispensing nozzle is expelled (i.e., pre-dispensing) in advance at the standby position, so that the developing solution which is supplied into the developing solution dispensing nozzle is homogenized.

However, in the conventional developing apparatus of spin type described above, when the developing solution hits the rotating substrate at the start of the dispensing of the developing solution, the photosensitive film on the substrate is subjected to a large impact. The impact creates air bubbles in the developing solution, and fine air bubbles which remain at a surface of the photosensitive film become development defects in some cases. Further, the impact of the developing solution at the start of the dispensing may damage the photosensitive film.

In addition, after the pre-dispensing, while the developing solution dispensing nozzle moves to the position above the substrate from the standby position, the developing solution in the vicinity of the dispensing opening of the developing solution dispensing nozzle contacts air. Due to this, it is possible that the properties of the developing solution which is supplied onto the substrate immediately after the start of the dispensing will change somewhat from those of the developing solution which is supplied successively and subsequently. Hence, development defects may be created on the substrate which contacts the developing solution which is supplied immediately after the start of the dispensing. Further, there is a possibility that the developing solution will dry out due to contact with air and the dried developing solution will adhere on the substrate as particles.

Moreover, since the developing solution becomes inhomogeneous during a process in which the developing solution which drops onto the substrate spreads out over the entire surface of the substrate because of centrifugal force, it is necessary to supply a large quantity of the developing solution until the developing solution on the substrate becomes homogeneous.

SUMMARY OF THE INVENTION

The present invention is directed to an apparatus for supplying a developing solution to a substrate.

According to the present invention, the apparatus comprises: a) substrate holding means for holding a substrate horizontally; b) a developing solution dispensing nozzle for dispensing a developing solution onto the substrate; c) moving means for moving the developing solution dispensing nozzle over the substrate which is held still by the substrate holding means, from a position on one side off the substrate to a position on the other side off the substrate; and d) control means for controlling a quantity of a supply of the developing solution from the developing solution dispensing nozzle onto the substrate per unit area constant, while the developing solution dispensing nozzle driven by the moving means passes over the substrate.

Hence, this avoids an uneven film thickness of the developing solution due to an excessive supply of the developing solution onto a substrate and a shortage of the developing solution due to repelling of the developing solution on the substrate, and therefore, it is possible to perform uniform development. The developing solution which is supplied to a substrate from the developing solution dispensing nozzle contains the developing solution which is dispensed directly onto the substrate from the developing solution dispensing nozzle and the developing solution which is supplied onto the substrate after adhering to the developing solution dispensing nozzle.

According to a preferred aspect of the present invention, the control means comprises speed control means which variably controls a travel speed of the developing solution dispensing nozzle while the developing solution dispensing nozzle driven by the moving means passes over the substrate.

According to other preferred aspect of the present invention, the control means comprises flow rate control means which variably controls a flow rate at which the developing solution dispensing nozzle dispenses the developing solution while the developing solution dispensing nozzle driven by the moving means passes over the substrate.

Further, an apparatus according to still other aspect of the present invention, an apparatus for supplying a developing solution to a substrate comprises: a) substrate holding means for holding a substrate horizontally; b) a developing solution dispensing nozzle for dispensing a developing solution onto the substrate; c) moving means for moving the developing solution dispensing nozzle over the substrate which is held still by the substrate holding means, from a travel start position off the substrate on one side to a travel end position off the substrate on the other side; and d) a solution removing member which is disposed between the travel start position and an edge of the substrate on the one side, the solution removing member removing the developing solution which adheres to a tip end of the developing solution dispensing nozzle.

As the developing solution dispensing nozzle moves past the solution removing member, the developing solution which adheres to the tip end of the developing solution dispensing nozzle is removed, so that the adhering developing solution will not be supplied to the substrate. This prevents a supply of the developing solution with changed properties, reduces an uneven film thickness of the developing solution due to an excessive supply of the developing solution, and avoids uneven development.

The present invention is also directed to a method of dispensing a developing solution onto a substrate and performing developing processing.

Accordingly, an object of the present invention is to provide a developing apparatus and a developing method with which it is possible to uniformly develop a photosensitive film on a substrate with only a small quantity of a developing solution.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a view showing a slit-like dispensing opening of a developing solution dispensing nozzle;

DESCRIPTION OF THE PREFERRED EMBODIMENTS

Diligently discussing and studying means for solving the problems with the conventional technique, the inventors of the present invention have found that as a method of avoiding an dispensed developing solution from applying an impact on a substrate, a developing solution dispensing nozzle may start dispensing the developing solution after starting to move but before reaching above a substrate which is held still, and the developing solution dispensing nozzle may thereafter move and supply the developing solution to the substrate.

Figure 15:
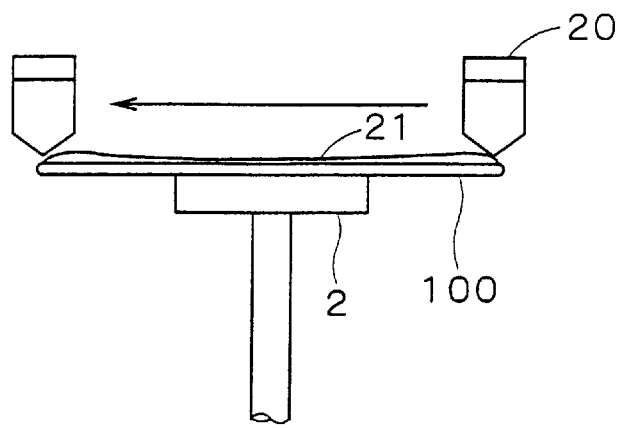
FIG. 15 is an explanatory diagram of an operation of a developing apparatus.
Figure 16:
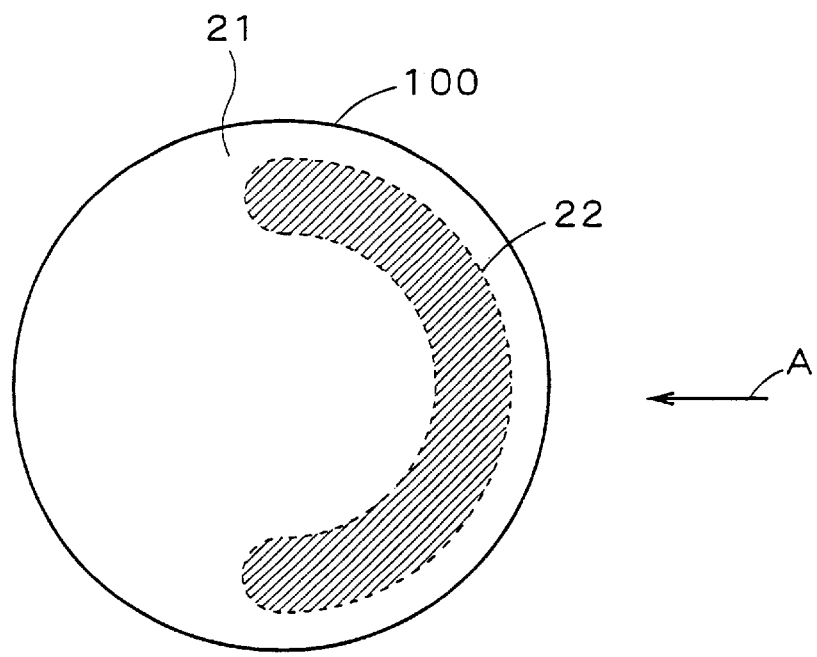
FIG. 16 is a schematic diagram showing a condition of a developing solution on a substrate in a developing apparatus.

Further, during conception of the present invention, the inventors of the present invention have found that if a developing solution dispensing nozzle 20 starts dispensing a developing solution before arriving at a substrate 100 and scans from one edge of the substrate 100 toward the other edge of the substrate 100 at a fixed speed as shown in FIG. 15, an area with an uneven film thickness is created in a film 21 of the developing solution on the substrate 100. FIG. 16 is a schematic plan diagram of a substrate with a developing solution dispensed thereonto. In FIG. 16, the arrow A denotes a scanning direction of the developing solution dispensing nozzle 20. On a surface of the substrate 100, an area 22 at which the film thickness of the developing solution is large is created in a portion which the developing solution dispensing nozzle 20 moves past initially. Hence, a development condition becomes different between the area 22 at which the film thickness of the developing solution is large and the other area, which leads to inhomogeneous development.

The inventors of the present invention have discussed a cause of such inhomogeneous development from various standpoints and identified that while the developing solution dispensing nozzle 20 scans initially, what is supplied to the surface of the substrate 100 is not only the developing solution which is dispensed from the developing solution dispensing nozzle 20 but also the developing solution adhering to a tip end of the developing solution dispensing nozzle 20 due to surface tension. Because of this, during initial scanning of the developing solution dispensing nozzle 20, a quantity of the developing solution which is supplied to the surface of the substrate 100 per unit area is large, and therefore, the film thickness becomes uneven.

On the basis of the above, the inventors of the present invention have made the present invention.

<First Preferred Embodiment>

Figure 1:
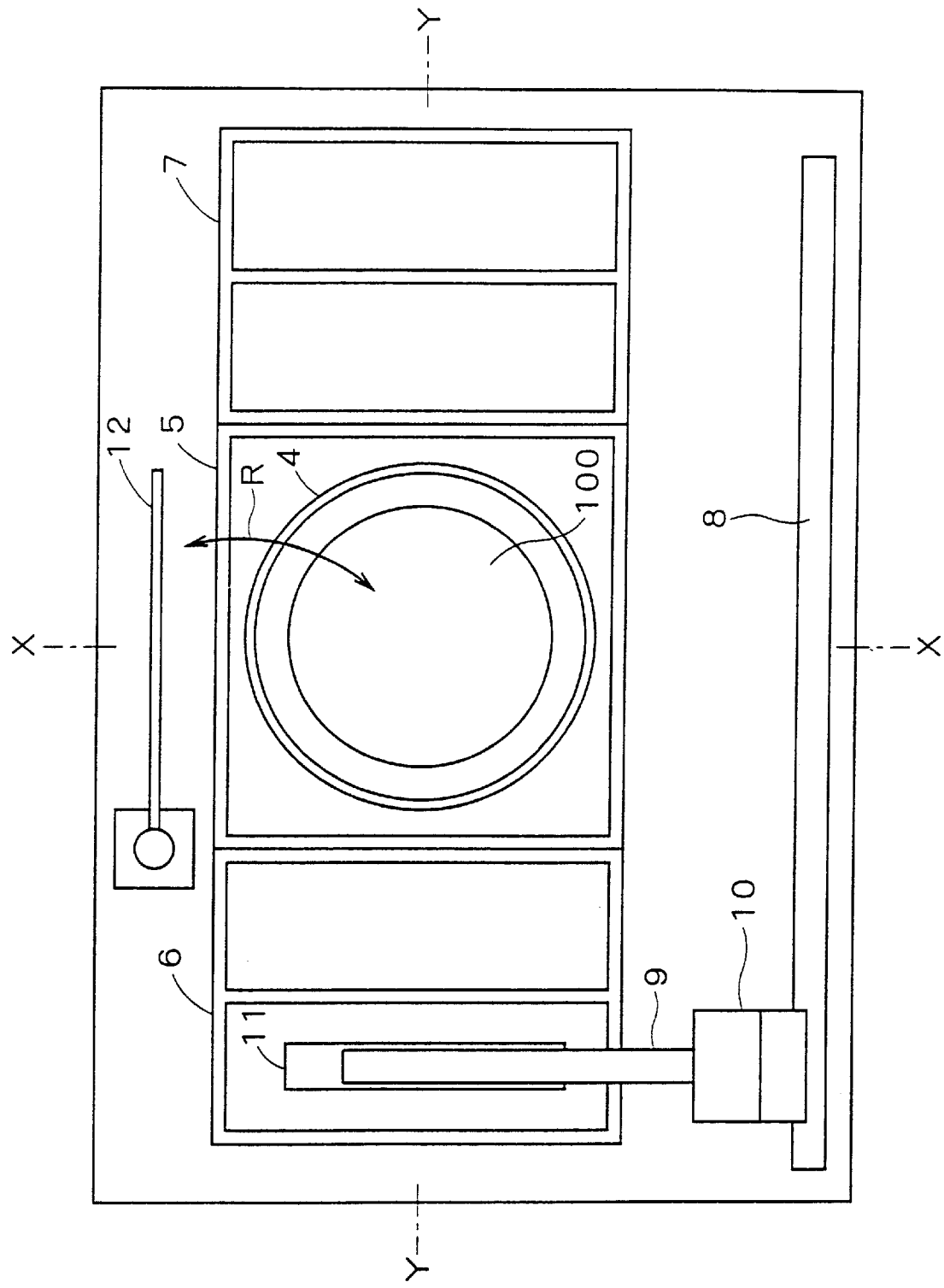
FIG. 1 is a plan view of a developing apparatus according to a first preferred embodiment of the present invention.
Figure 2A:
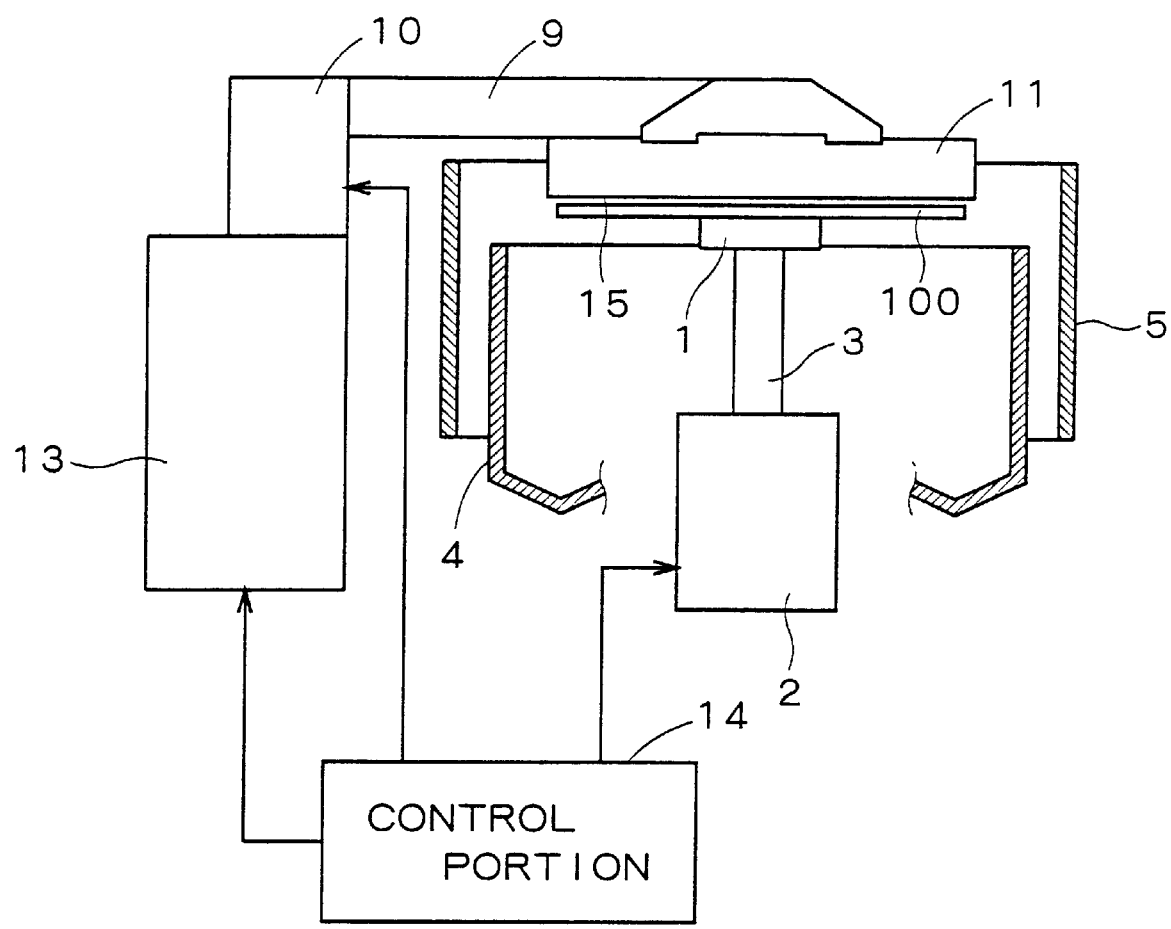
FIG. 2A is a cross sectional view of a principal portion of the developing apparatus of FIG. 1 taken along the X—X line.
Figure 3:
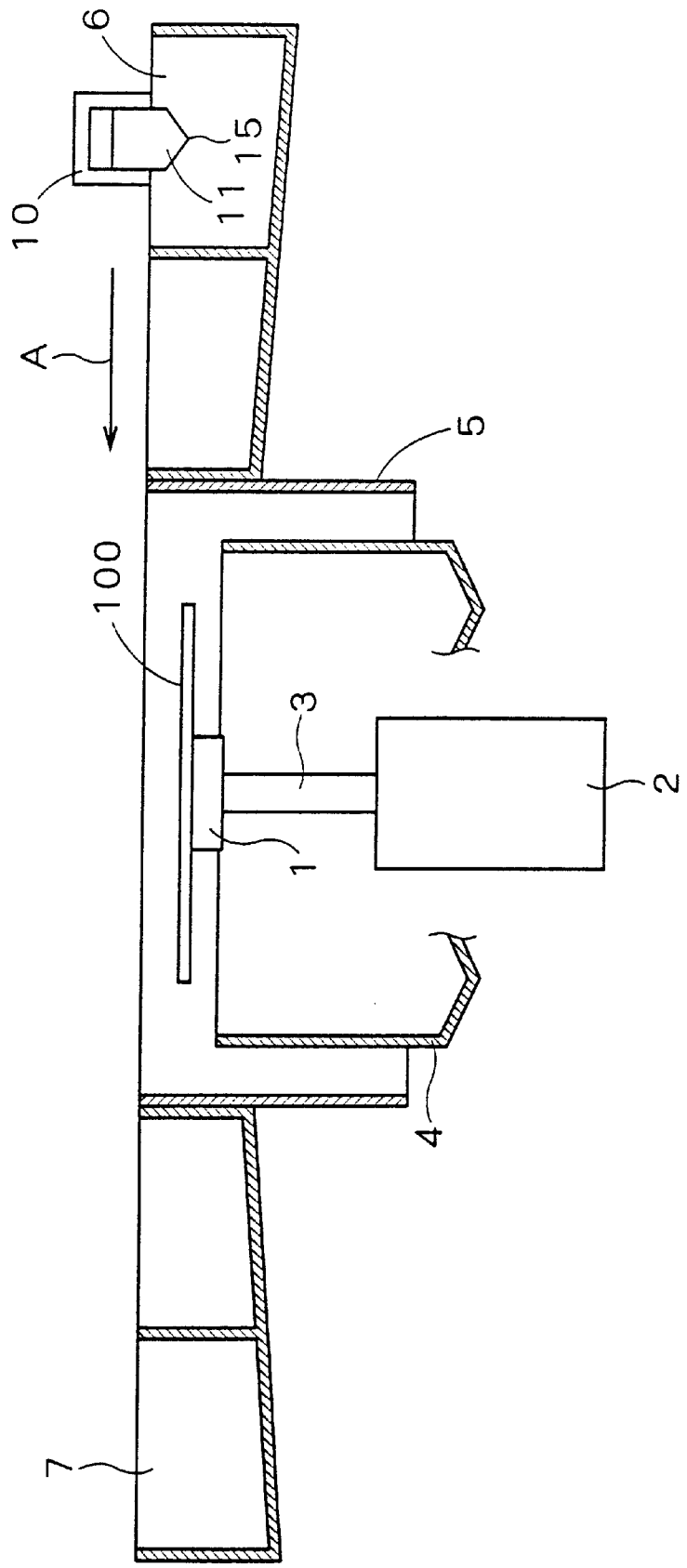
FIG. 3 is a cross sectional view of a principal portion of the developing apparatus of FIG. 1 taken along the Y—Y line.

FIG. 1 is a plan view of a developing apparatus according to a first preferred embodiment of the present invention, FIG. 2A is a cross sectional view of a principal portion of the developing apparatus of FIG. 1 taken along the X—X line, and FIG. 3 is a cross sectional view of a principal portion of the developing apparatus of FIG. 1 taken along the Y—Y line.

As shown in FIGS. 2A and 3, the developing apparatus comprises a substrate holding portion (substrate holding means) 1 which sucks and horizontally holds a substrate 100. The substrate holding portion 1 is fixed to a tip end portion of a rotation shaft 3 of a motor 2, for free rotation about the shaft which extends in the vertical direction. Around the substrate holding portion 1, a circular inner cup 4 is disposed to surround a substrate 100 for free upward and downward movement. A square outer cup 5 is disposed around the inner cup 4.

As shown in FIG. 1, standby pots 6, 7 are arranged on the both sides of the outer cup 5, and a guide rail 8 is disposed on one side of the outer cup 5. Further, a nozzle arm 9 is disposed along the guide rail 8 so that the nozzle arm 9 is movable in a scanning direction A and an opposite direction when driven by an arm driving portion (moving means) 10. On the other side of the outer cup 5, a deionized water dispensing nozzle 12 for dispensing deionized water is disposed to a side portion of the outer cup 5 so as to be revolvable in the direction of the arrow R.

A developing solution dispensing nozzle 11, which comprises a slit-like dispensing opening 15 which is formed in a bottom end portion of the developing solution dispensing nozzle 11, is attached to the nozzle arm 9 in a perpendicular direction to the guide rail 8. This allows the developing solution dispensing nozzle 11 to move over a substrate 100, linearly from the position of the standby pot 6 to the position of the standby pot 7 along and parallel to the scanning direction A.

As shown in FIG. 2A, a developing solution supplying system 13 supplies the developing solution to the developing solution dispensing nozzle 11. The developing solution supplying system 13 comprises a flow rate adjusting valve which adjusts a flow rate of the developing solution which is allowed to the developing solution dispensing nozzle 11. A control portion 14 controls rotation of the motor 2, scanning of the developing solution dispensing nozzle 11 by the arm driving portion 10 and dispensing of the developing solution from the developing solution dispensing nozzle 11.

Figure 2B:
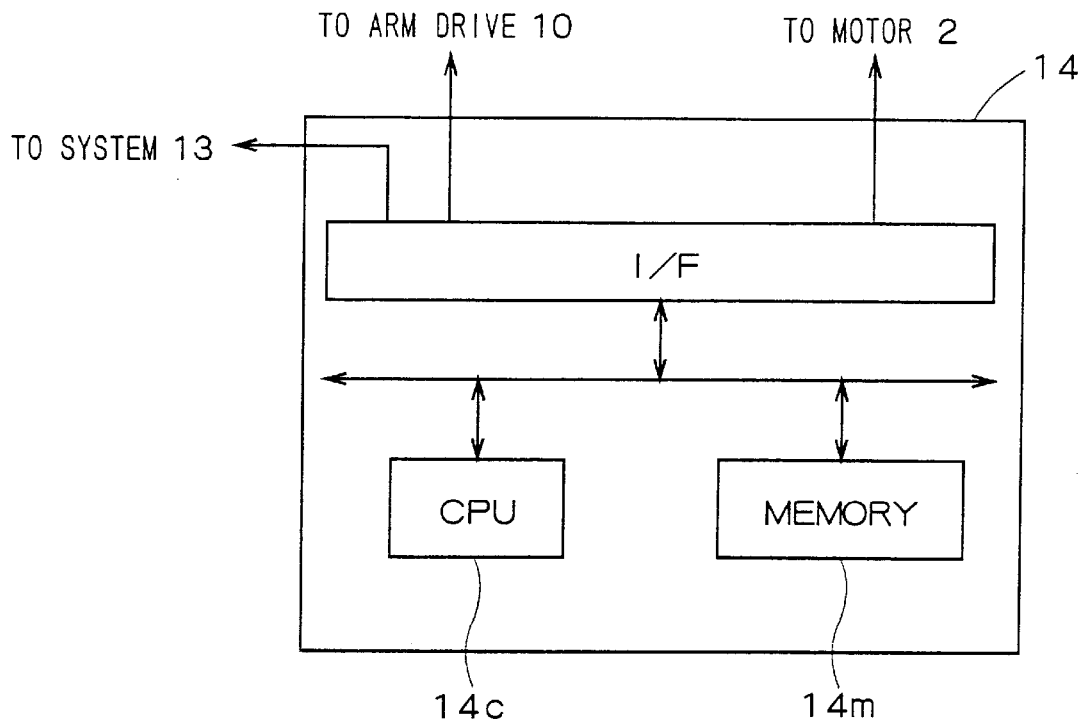
FIG. 2B is a block diagram illustrating elements included in a control portion 14.

As illustrated in FIG. 2B, the control portion 14 includes a CPU 14c and a memory 14m. The CPU 14c is coupled to the memory 14m and is operable to control the motor 2, the arm driving portion 10 and the developing solution supplying system 13 in accordance with control programs stored in the memory 14m.

Figure 2C:
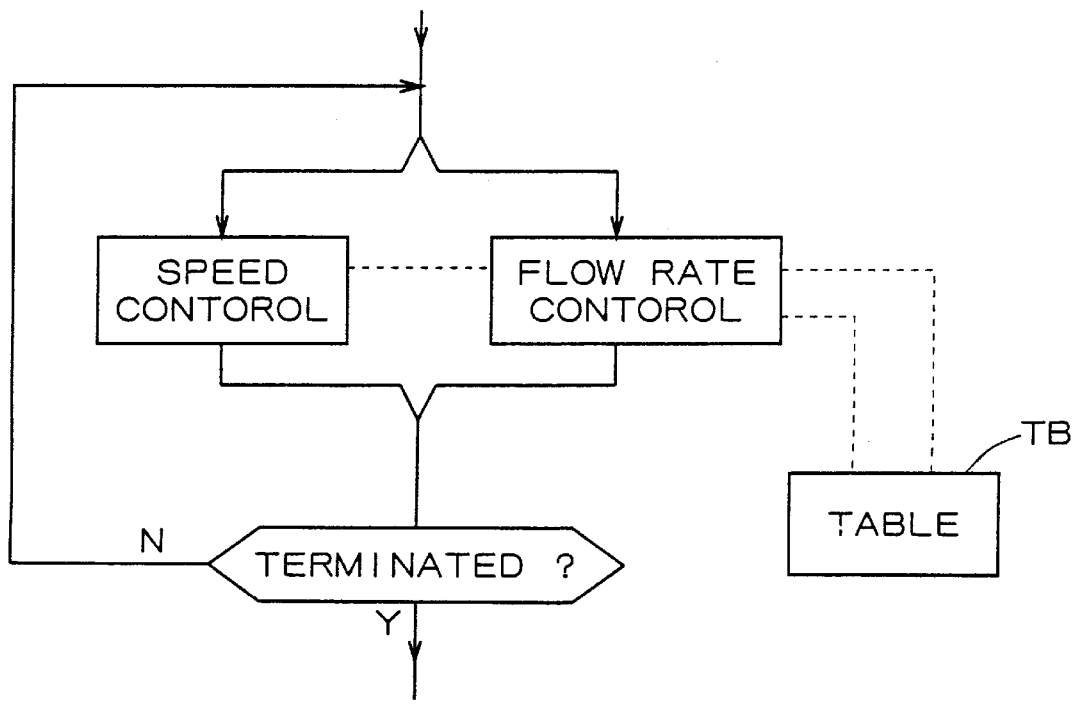
FIG. 2C is a conceptual flow chart showing the operation conducted by a CPU 14c.
Figure 8:
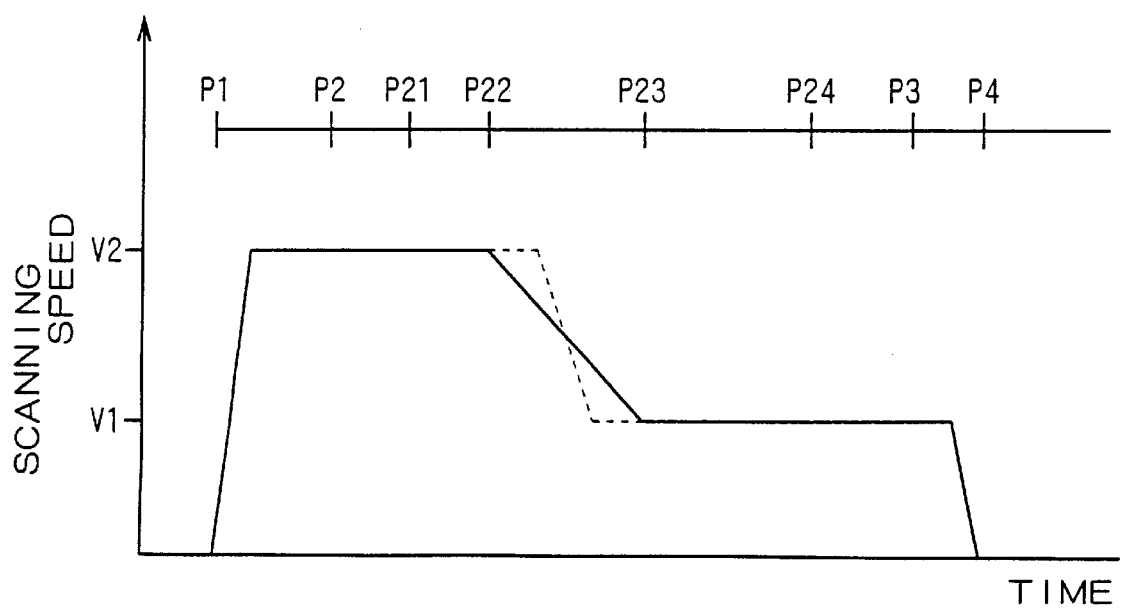
FIG. 8 is a view showing a scanning speed of the developing solution dispensing nozzle.

In the first preferred embodiment, the developing solution supplying system 13 and the control portion 14 correspond to control means, and the control portion 14 corresponds to flow rate control means and speed control means. That is, as shown in FIG. 2C, the CPU conducts a multi-task for speed control of movement of the developing solution dispensing nozzle 11 and flow rate control of the developing solution dispensed through the developing solution dispensing nozzle 11. The CPU 14c refers to a table TB stored in the memory 14m of FIG. 2B. The table TB includes: a first set of a speed pattern as illustrated in FIG. 8 and a constant flow rate value; or alternatively, a second set of a flow rate pattern illustrated in FIG. 9 and a constant speed value.

In accordance with the table TB, the CPU 14c generates a speed control signal and a flow rate control signal for the developing solution dispensing nozzle 11. After outputting the control signals, the CPU 14c determines whether one control period is terminated or not. If not terminated, the control routine is repeated to update the speed control and the flow rate control in accordance with the table TB, whereby the speed control or the flow rate control is changed in accordance with the patten stored in the table TB. Details of the control routine will be described later.

FIG. 4 is a view showing the slit-like dispensing opening 15 of the developing solution dispensing nozzle 11. A slit width t of the slit-like dispensing opening 15 is 0.02 to 0.5 mm. In the first preferred embodiment, the slit width t is 0.1 mm. Further, an dispensing width L of the slit-like dispensing opening 15 is set to be equal to or larger than the diameter of a substrate 100 which is to be processed. The slit-like dispensing opening 15 is arranged perpendicularly to the scanning direction A in which of the developing solution dispensing nozzle 11 scans.

The developing solution dispensing nozzle 11 scans, with a gap of 0.2 to 5 mm, more preferably, 0.5 to 1.5 mm between the slit-like dispensing opening 15 and a top surface of a substrate 100. In the first preferred embodiment, the gap between the slit-like dispensing opening 15 of the developing solution dispensing nozzle 11 and a top surface of a substrate 100 is set to 1.0±0.1 mm.

Figure 5:
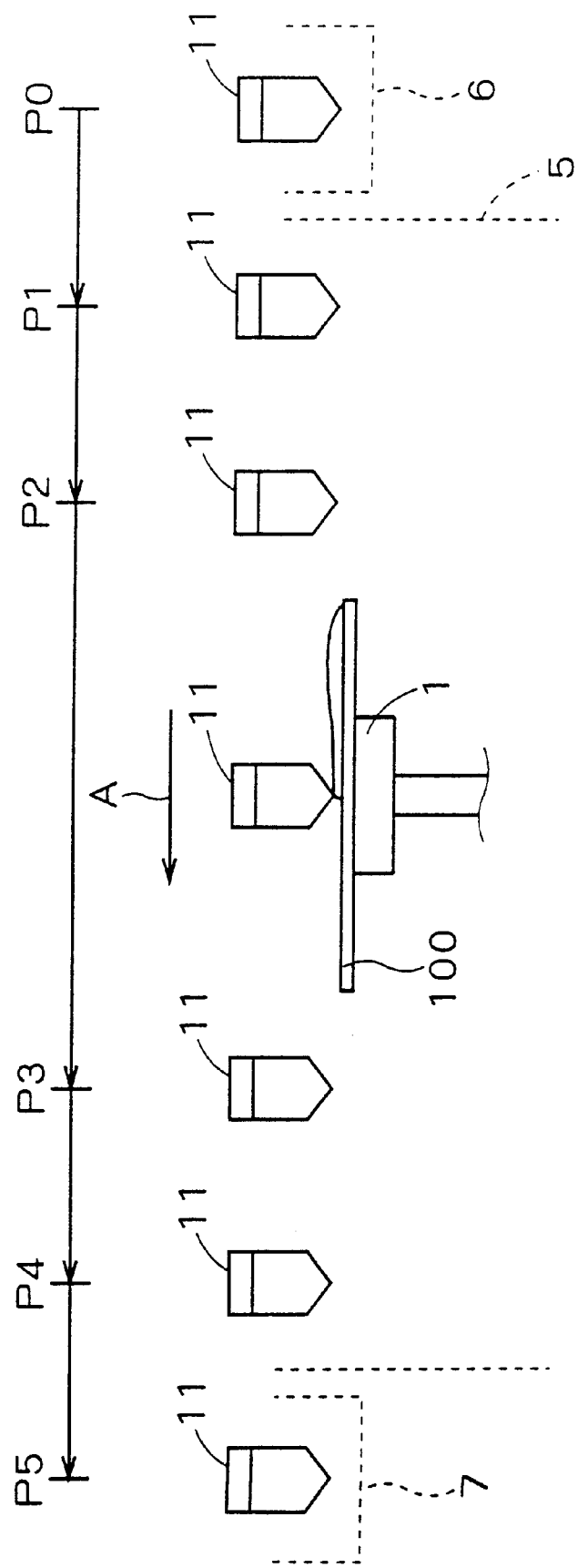
FIG. 5 is a view for describing an operation of the developing apparatus of FIG. 1.

Next, an operation of the developing apparatus shown in FIG. 1 will be described with reference to FIG. 5. FIG. 5 is an explanatory diagram for describing an operation of the developing apparatus which is shown in FIG. 1. During the developing processing described below, a substrate 100 is held still by the substrate holding portion 1.

As shown in FIG. 5, during a standby period, the developing solution dispensing nozzle 11 stands by at a position P0 within the standby pot 6. During the developing processing, after moving upward, the developing solution dispensing nozzle 11 moves in the scanning direction A and descends at a scanning start position P1 within the outer cup 5.

Following this, at the scanning start position P1, the developing solution dispensing nozzle 11 starts scanning at a predetermined scanning speed. At this stage, the developing solution dispensing nozzle 11 is not yet to dispense the developing solution.

After the developing solution dispensing nozzle 11 started scanning, before the slit-like dispensing opening 15 of the developing solution dispensing nozzle 11 reaches over a substrate 100, at an dispensing start position P2, the developing solution dispensing nozzle 11 starts dispensing the developing solution at a predetermined flow rate.

The developing solution dispensing nozzle 11 moves over the substrate 100 linearly in the scanning direction A from the dispensing start position P2, while dispensing the developing solution. As a result, the developing solution is supplied successively to the entire surface of the substrate 100. The supplied developing solution is held on the substrate 100 because of the surface tension of the developing solution. An operation for supplying the developing solution during this section will be described in detail later.

After the developing solution dispensing nozzle 11 passed over the substrate 100, the dispensing of the developing solution from the developing solution dispensing nozzle 11 is stopped at an dispensing stop position P3 which is off the substrate 100. Upon arrival of the developing solution dispensing nozzle 11 at a scanning stop position P4 within the outer cup 5, the developing solution dispensing nozzle 11 stops scanning.

Following this, after ascending to the scanning stop position P4, the developing solution dispensing nozzle 11 moves to a position P5 of the other standby pot 7 and descends within the standby pot 7.

The condition that the developing solution is supplied on the substrate 100 is maintained for a certain period of time (e.g., 60 seconds), so that development progresses. At this stage, the motor 2 may drive the substrate holding portion 1 to rotate the substrate 100. Following this, the substrate 100 is rotated while supplying deionized water from the deionized water dispensing nozzle 12 onto the substrate 100 to thereby wash away the developing solution on the substrate 100, and the supply of the deionized water is stopped. The substrate 100 is thereafter rotated at a high speed to spin off the deionized water and is then dried, thereby completing the developing processing.

Figure 6A:
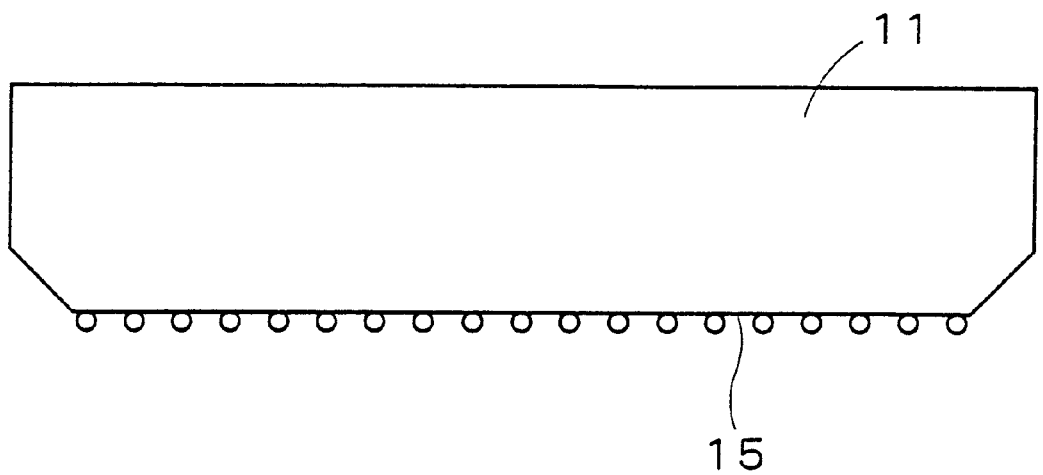
FIGS. 6A and 6B are front views showing an dispensing condition in which the developing solution dispensing nozzle dispenses a developing solution.
Figure 6B:
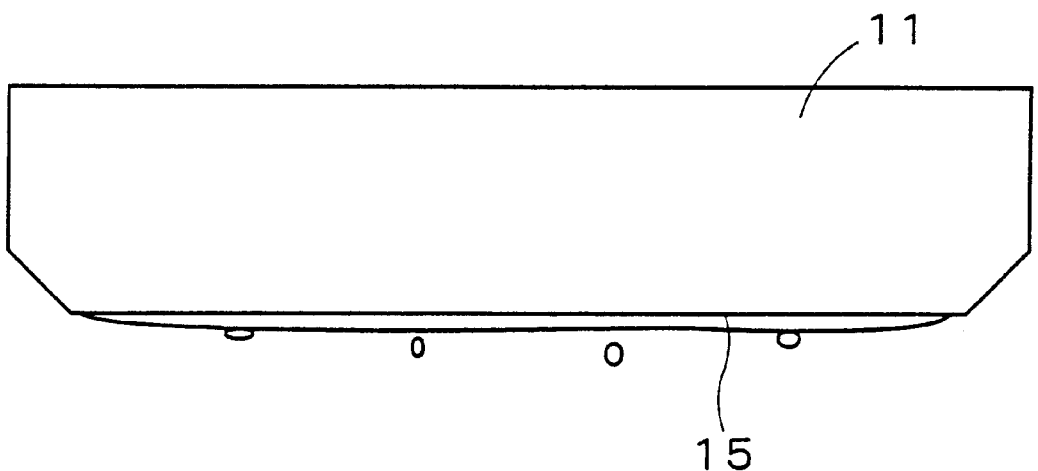

FIGS. 6A and 6B are front views showing an dispensing condition in which the developing solution dispensing nozzle 11 dispenses a developing solution. As shown in FIG. 6A, immediately after dispensed, the developing solution oozes out as a drop at the slit-like dispensing opening 15. After a certain period of time elapsed since the dispensing of the developing solution, as shown in FIG. 6B, drops of the developing solution join with each other, whereby the developing solution emerges as a band along the slit-like dispensing opening 15.

The scanning start position P1 described above is set in such a manner that the scanning speed of the developing solution dispensing nozzle 11 reaches a predetermined speed before the developing solution dispensing nozzle 11 arrives at an edge of a substrate 100 since the start of scanning and that a necessary time is ensured for the developing solution at the slit-like dispensing opening 15 to become like a band as shown in FIG. 6B. For example, the scanning start position P1 is set at about 10 to 100 mm from an edge of a substrate 100 in an opposite direction to the scanning direction A. The first preferred embodiment requires that the scanning start position P1 is set at a position 50 mm away from an edge of a substrate 100.

On the other hand, the dispensing start position P2 is set in such a manner that a necessary time is ensured for the developing solution to take a form of a band before the developing solution dispensing nozzle 11 arrives at an edge of a substrate 100, depending on the scanning speed of the developing solution dispensing nozzle 11 and the flow rate of the developing solution.

Since the developing solution dispensing nozzle 11 reaches an edge of a substrate 100 from the scanning start position P1 in a shorter period of time as the scanning speed becomes faster, the dispensing start position P2 is set close to the scanning start position P1. For example, if the scanning speed is 100 mm/sec, dispensing of the developing solution is started in 0.3 second since the start of scanning, whereas if the scanning speed is 30 mm/sec, dispensing of the developing solution is started in 1.3 second since the start of scanning.

Further, since the developing solution takes a form of a band in a short period of time if the flow rate of the developing solution is large, the dispensing start position P2 is set close to an edge of a substrate 100. For instance, if the flow rate of the developing solution is 1.5 L/min and the scanning speed is 70 mm sec, dispensing of the developing solution is started 0.1 to 1.0 second (e.g., 0.2/sec, sec) before the developing solution dispensing nozzle 11 arrives at an edge of a substrate 100.

To reduce a wasteful use of the developing solution, it is desirable to set the dispensing start position P2 close to an edge of a substrate 100, in a range which allows the developing solution to take a form of a band before the developing solution dispensing nozzle 11 arrives at an edge of a substrate 100.

Figure 7:
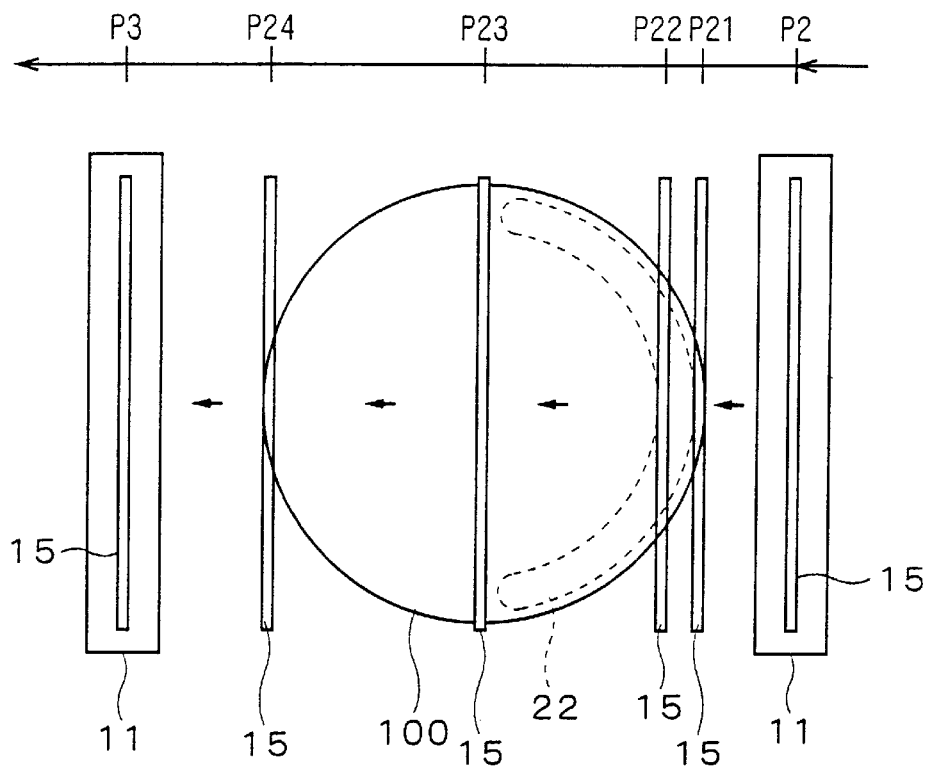
FIG. 7 is a plan view showing a scanning operation of the developing solution dispensing nozzle.

Now, an operation for dispensing the developing solution over a substrate will be described. FIG. 7 is a plan view showing a scanning operation of the developing solution dispensing nozzle.

In the developing apparatus according to the first preferred embodiment, as a first method to ensure uniform supply of the developing solution onto a substrate 100, the scanning speed of the developing solution dispensing nozzle 11 is variably controlled. FIG. 8 is a view showing the scanning speed of the developing solution dispensing nozzle. In FIGS. 7 and 8, a position P21 is the position of an edge of a substrate 100 on one side, a position P22 is a slowing down start position at which the developing solution dispensing nozzle 11 starts to slow down scanning, a position P23 is a slowing down end position, and a position P24 is the position of an edge of the substrate 100 on the other side. In addition, a position P2 is a dispensing start position at which dispensing of the developing solution is started, and a position P3 is a dispensing end position.

As described earlier referring to FIGS. 15 and 16, in the case of the conventional technique where the developing solution dispensing nozzle 11 scans over a substrate at a constant speed with a constant flow rate, the area 22 at which the film thickness of the developing solution is large is created during the initial scanning section, while the film thickness of the developing solution is approximately uniform in the other remaining scanning section.

Noting this, first, the scanning speed is controlled constant during a section from the slowing down end position P23 to the edge position P24 of the substrate on the other side, which corresponds to the remaining scanning section. That is, the developing solution dispensing nozzle 11 scans at a scanning speed V1 which allows the flow rate from the developing solution dispensing nozzle 11, which is set constant, to build the developing solution into a desired film thickness.

Meanwhile, during a section from the edge position P21 of the substrate on the one side to the slowing down end position P23 which corresponds to the initial scanning section, the scanning speed of the developing solution dispensing nozzle 11 is variably controlled. In other words, during this section, not only the developing solution which is dispensed from the developing solution dispensing nozzle 11 but the developing solution adhering to a tip end of the developing solution dispensing nozzle 11 as well is supplied to a surface of a substrate 100, whereby a quantity of the supply of the developing solution exceeds a predetermined quantity. To deal with this, a scanning speed V2 of the developing solution dispensing nozzle 11 is set larger than the scanning speed V1 which realizes a desired film thickness of the developing solution. The developing solution dispensing nozzle 11 scans at a relatively high speed, and after the developing solution dispensing nozzle 11 arrives at the slowing down start position P22, the developing solution dispensing nozzle 11 gradually slows down.

As the developing solution dispensing nozzle 11 scans at a high speed initially after starting to supply the developing solution to a substrate 100, thereafter gradually slows down and further scans at a constant low speed in the manner described immediately above, a quantity of the developing solution which is supplied to a surface of the substrate 100 per unit area becomes uniform.

For example, in the case that a substrate 100 is a wafer whose diameter is 200 mm, the slowing down start position P22 is set to 10 to 50 mm from an edge of the substrate, 25 mm in a specific example, while the scanning speed V2 of a high speed is set in a range of 100 to 200 mm/sec and the scanning speed V1 of a low speed is set in a range of 50 to 150 mm/sec.

If a substrate is circular, slowing down from the scanning speed V2 to the scanning speed V1 is preferably graduate as indicated at the solid line in FIG. 8. If a substrate is rectangle, slowing down is preferably completed in a short period of time as indicated at the dotted line in FIG. 8.

Figure 9:
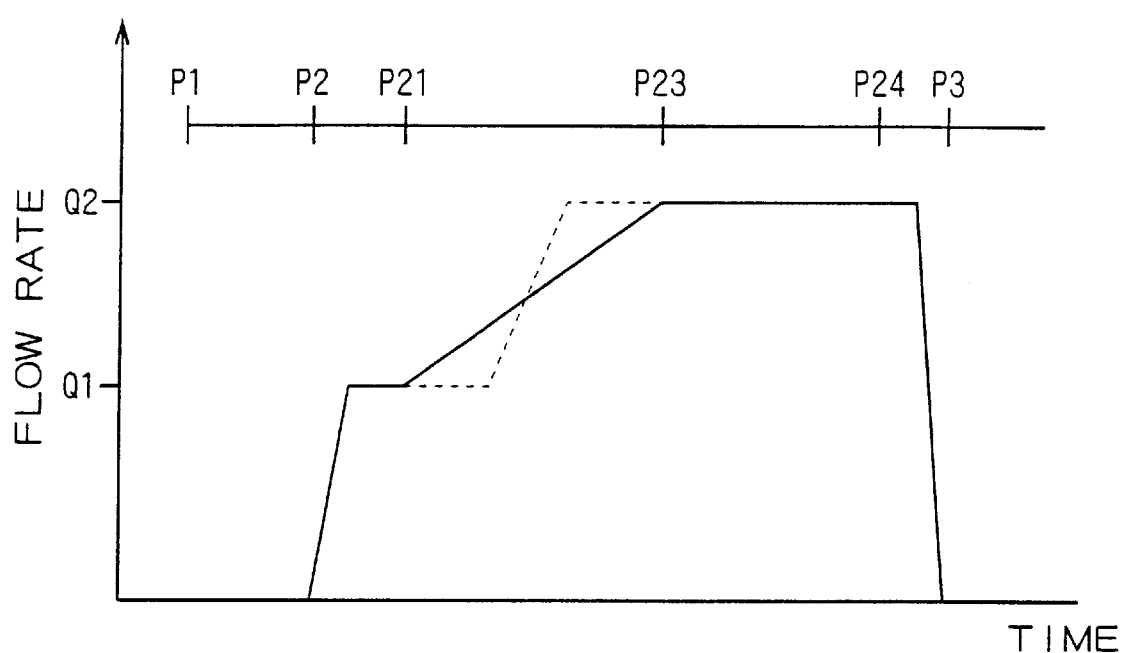
FIG. 9 is a view showing a flow rate at which the developing solution dispensing nozzle dispenses.

As a second method to ensure an uniform supply of the developing solution onto a substrate, the flow rate of the developing solution is variably controlled. FIG. 9 is a view showing a flow rate at which the developing solution dispensing nozzle dispenses the developing solution. In FIGS. 7 and 9, a position P21 is the position of an edge of a substrate 100 on one side, which is also a flow rate increase start position at which the developing solution dispensing nozzle 11 increases the flow rate, a position P23 is a flow rate increase end position, and a position P24 is the position of an edge of the substrate 100 on the other side. In addition, a position P2 is a dispensing start position at which dispensing of the developing solution is started, and a position P3 is a dispensing end position.

The second method first requires to set the scanning speed of the developing solution dispensing nozzle 11 constant. In a section from the flow rate increase end position P23 to the edge position P24 of the substrate on the other side which corresponds to the remaining scanning section, the flow rate of the developing solution from the developing solution dispensing nozzle 11 is controlled at a constant value Q2. The flow rate is controlled, as the control portion 14 controls an operation of the flow rate adjusting valve of the developing solution supplying system 13. The flow rate Q2 is set to such a quantity with which the developing solution builds up in a predetermined film thickness on a surface of the substrate 100 when the developing solution dispensing nozzle 11 moves at the set scanning speed.

Meanwhile, in a section from the edge position P21 of the substrate on the one side (i.e., the flow rate increase start position) to the flow rate increase end position P23 which corresponds to the initial scanning section, the flow rate of the developing solution from the developing solution dispensing nozzle 11 is increased from Q1 to Q2. That is, during this section, not only the developing solution which is dispensed from the developing solution dispensing nozzle 11 but the developing solution adhering to the tip end of the developing solution dispensing nozzle 11 as well is supplied to a surface of a substrate 100. To deal with this, the flow rate Q1 from the developing solution dispensing nozzle 11 is set smaller than the flow rate Q2 which is necessary for the developing solution to amount to the predetermined film thickness, and the flow rate is increased gradually up to Q2 while the developing solution dispensing nozzle 11 scans. As a result, a total flow rate of the developing solution adhering to the tip end of the developing solution dispensing nozzle 11 and the developing solution which is dispensed in a gradually increasing amount from the developing solution dispensing nozzle 11 becomes uniform per unit area on the surface of the substrate. Further, after the developing solution adhering to the tip end of the developing solution dispensing nozzle 11 is removed, that is, after the developing solution dispensing nozzle 11 arrives at the flow rate increase end position P23, the developing solution is supplied at the constant flow rate Q2. This makes it possible to build up the developing solution in an uniform film thickness on the surface of the substrate 100.

If a substrate is circular, the flow rate is changed preferably gradually from Q1 to Q2 as indicated at the solid line in FIG. 9. If a substrate is rectangle, the flow rate is changed preferably in a short period of time as indicated at the dotted line in FIG. 9.

Further, to supply the developing solution uniformly to a surface of a substrate, both the first method and the second method described above may be used. In this case, the scanning speed of the developing solution dispensing nozzle 11 and the flow rate from the developing solution dispensing nozzle 11 may be variably controlled at the same time or alternately, during the scanning section which tends to create an uneven film thickness of the developing solution.

Moreover, the scanning speed of the developing solution dispensing nozzle 11 and the flow rate from the developing solution dispensing nozzle 11 described above may be variably controlled step by step in two or more stages.

As described above, in the developing apparatus according to the first preferred embodiment, since the developing solution dispensing nozzle 11 starts dispensing the developing solution before arriving over a substrate 100 which is held still, the developing solution which is dispensed at the start of dispensing is prevented from impacting the substrate 100. This suppresses creation of air bubbles in the developing solution, and hence, creation of development defects.

Further, the developing solution which is near the slit-like dispensing opening 15 and contacts air during traveling of the developing solution dispensing nozzle 11 is discharged off a substrate 100, and when the developing solution dispensing nozzle 11 arrives above the substrate 100, a new developing solution is supplied onto the stationary substrate 100 from the developing solution dispensing nozzle 11. This prevents the developing solution with changed properties from creating development defects, and further prevents particles of a dried developing solution from adhering to a surface of a photosensitive film which is formed on the substrate 100.

Still further, the developing solution dispensing nozzle 11 moves over a stationary substrate 100 linearly in a parallel direction, with the slit-like dispensing opening 15 and a top surface of the substrate 100 kept close to each other, and the developing solution which takes a form of a band at the slit-like dispensing opening 15 continuously contacts the surface of the substrate 100, and therefore, the developing solution is uniformly supplied onto the entire surface of the substrate 100 without impacting the surface of the substrate 100.

In addition, since the supply of the developing solution is continued until the developing solution dispensing nozzle 11 passes over a substrate 100, an impact which is created when the dispensing is stopped is prevented from exerting an adverse influence over the developing solution which is still in the process of building up. As a result, creation of development defects is suppressed while the uniformity of the linewidth of a pattern of a developed photosensitive film is improved.

Further, since the dispensing of the developing solution is stopped after the developing solution dispensing nozzle 11 passes over a substrate 100, the developing solution which drops down as the dispensing is stopped is prevented from impacting a photosensitive film which is formed on the substrate 100. This suppresses creation of development defects and a deterioration in the uniformity of the linewidth of a pattern of a photosensitive film.

Further, since the scanning speed of the developing solution dispensing nozzle 11 or the flow rate from the developing solution dispensing nozzle 11 is variably controlled, the developing solution is uniformly supplied to a surface of a substrate. This prevents uneven development, a deterioration in the uniformity of the linewidth of a photosensitive film pattern, etc., due to an uneven supply of the developing solution.

In addition, while the first preferred embodiment is related to methods of controlling a quantity of a supply of the developing solution for a case that the developing solution dispensing nozzle 11 supplies the developing solution excessively onto a substrate during the initial scanning section upon start of scanning, it was identified that a quantity of a supply of the developing solution becomes smaller than necessary and a film thickness of the developing solution accordingly becomes small also at a rear edge portion of a substrate 100 as viewed in the direction in which the developing solution dispensing nozzle 11 passes over the substrate 100. This is because as the developing solution dispensing nozzle 11 passes over the rear edge portion of the substrate 100, the developing solution dispensing nozzle 11 carries away the developing solution from over the substrate 100 and the surface tension of the developing solution reduces a quantity of a supply of the developing solution onto the substrate 100. To deal with this, as in the first preferred embodiment, the flow rate of the developing solution from the developing solution dispensing nozzle 11 is increased larger than in the other scanning section also during the scanning section in which the developing solution dispensing nozzle 11 passes over the rear edge portion of a substrate 100, or the scanning speed of the developing solution dispensing nozzle 11 is reduced in this scanning section which corresponds to a travel over the rear edge portion. This makes it possible to supply the developing solution uniformly per unit area, and hence, to prevent creation of development defects and a deterioration in the uniformity of the linewidth of a pattern of a photosensitive film.

<Second Preferred Embodiment>

Figure 10:
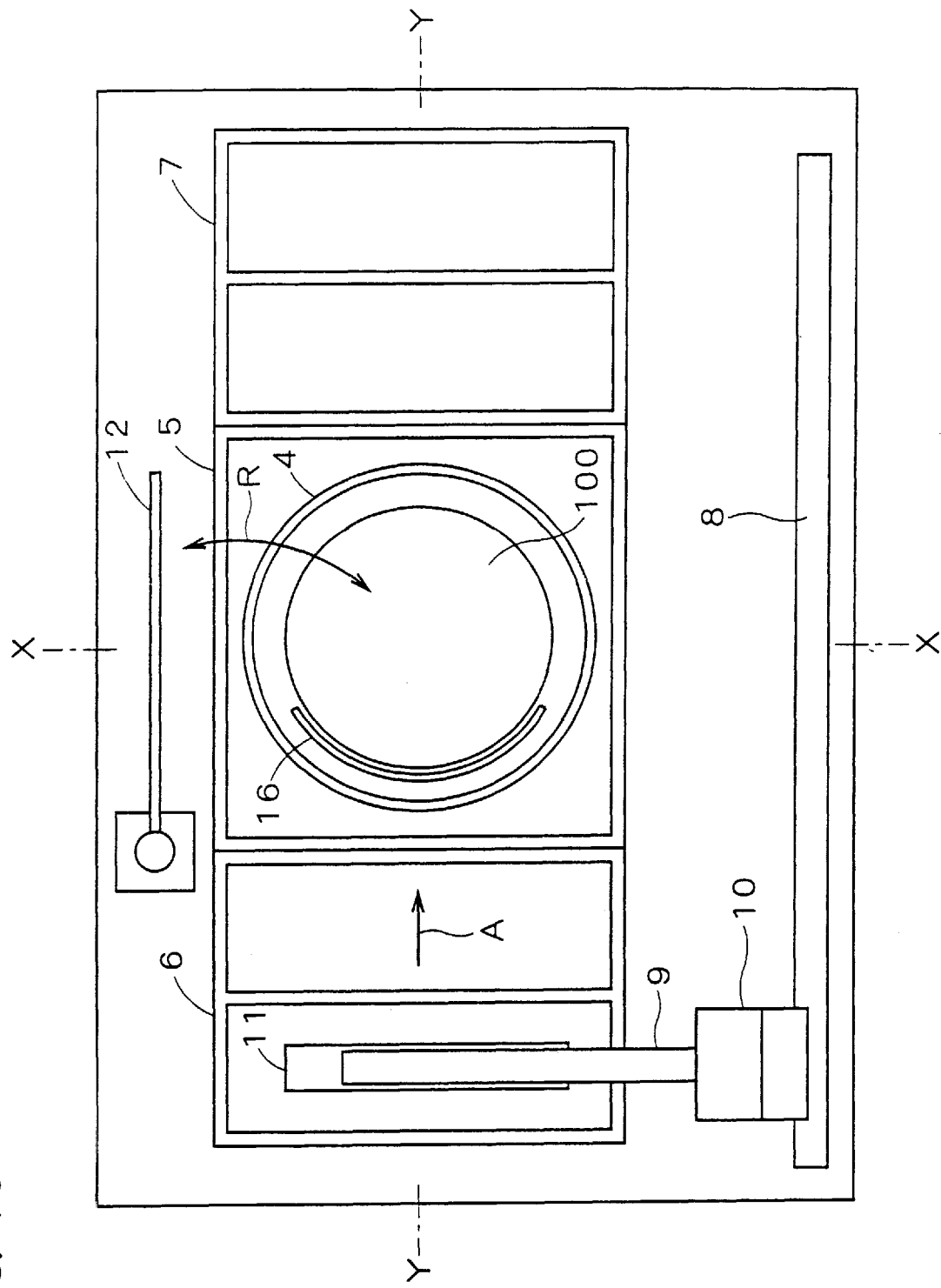
FIG. 10 is a plan view of a developing apparatus according to a second preferred embodiment of the present invention.
Figure 11:
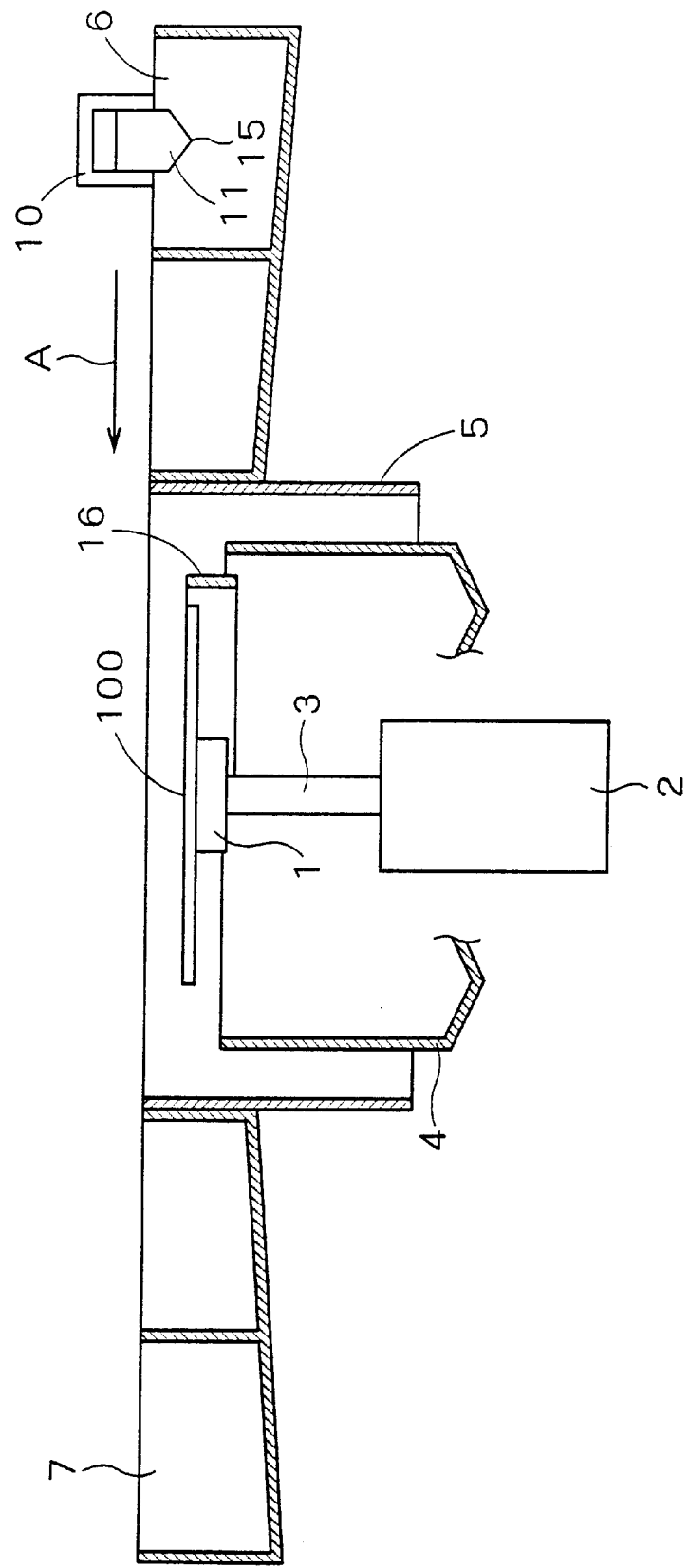
FIG. 11 is a cross sectional view of a principal portion of the developing apparatus of FIG. 10 taken along the Y—Y line.

FIG. 10 is a plan view of a developing apparatus according to a second preferred embodiment of the present invention, and FIG. 11 is a cross sectional view of a principal portion of the developing apparatus of FIG. 10 taken along the Y—Y line. A cross sectional view of the principal portion of the developing apparatus of FIG. 10 taken along the X—X line is the same as FIG. 2.

A difference of the developing apparatus according to the second preferred embodiment from the developing apparatus according to the first preferred embodiment is that a solution removing member 16 is disposed inside the inner cup 4. The solution removing member 16 is formed in the form of an arc, slightly off an edge of a substrate 100 toward a travel start position of the developing solution dispensing nozzle 11. A top edge portion 16a of the solution removing member 16 is located at such height which allows the top edge portion 16a to contact the developing solution which adheres to the slit-like dispensing opening 15 of the developing solution dispensing nozzle 11 and a portion around the same. In addition, the size of the solution removing member 16 in a direction along the slit-like dispensing opening 15 of the developing solution dispensing nozzle 11 is larger than the dispensing width L of the slit-like dispensing opening 15.

Figure 13:
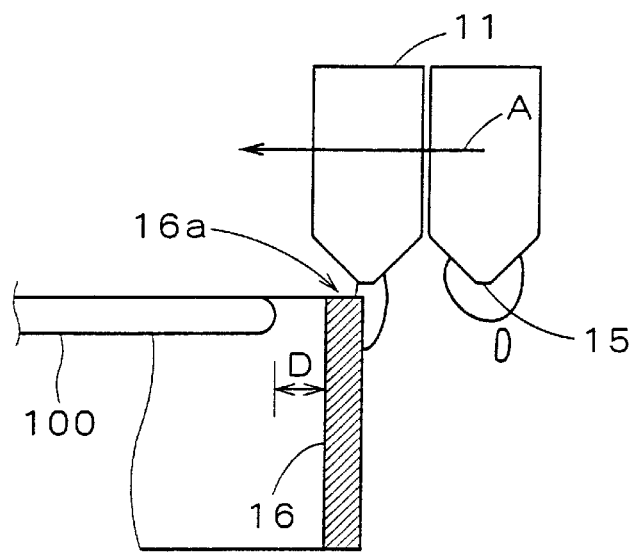
FIG. 13 is an explanatory diagram showing an operation of a solution removing member.

FIG. 13 is an explanatory diagram showing an operation of a solution removing member. A horizontal distance D between the solution removing member 16 and an edge of a substrate 100 is set to such a value which prohibits the developing solution which is removed by the solution removing member 16 from staying in a gap between the substrate 100 and the solution removing member 16. For instance, the horizontal distance D is set within a range of 2 to 20 mm. In the second preferred embodiment, the horizontal distance D is set to 10 mm. The solution removing member 16 is disposed to be freely moved in the vertical direction by an elevating mechanism not shown. During developing processing, the solution removing member 16 moves upward and removes the developing solution adhering to the tip end of the developing solution dispensing nozzle 11. For loading and unloading of a substrate 100, the solution removing member 16 moves downward so that the substrate 100 is loaded to or unloaded from the substrate holding portion 1. Except for that the solution removing member 16 is disposed, the developing apparatus according to the second preferred embodiment is exactly the same as the developing apparatus according to the first preferred embodiment (See FIGS. 1 through 4).

Figure 12:
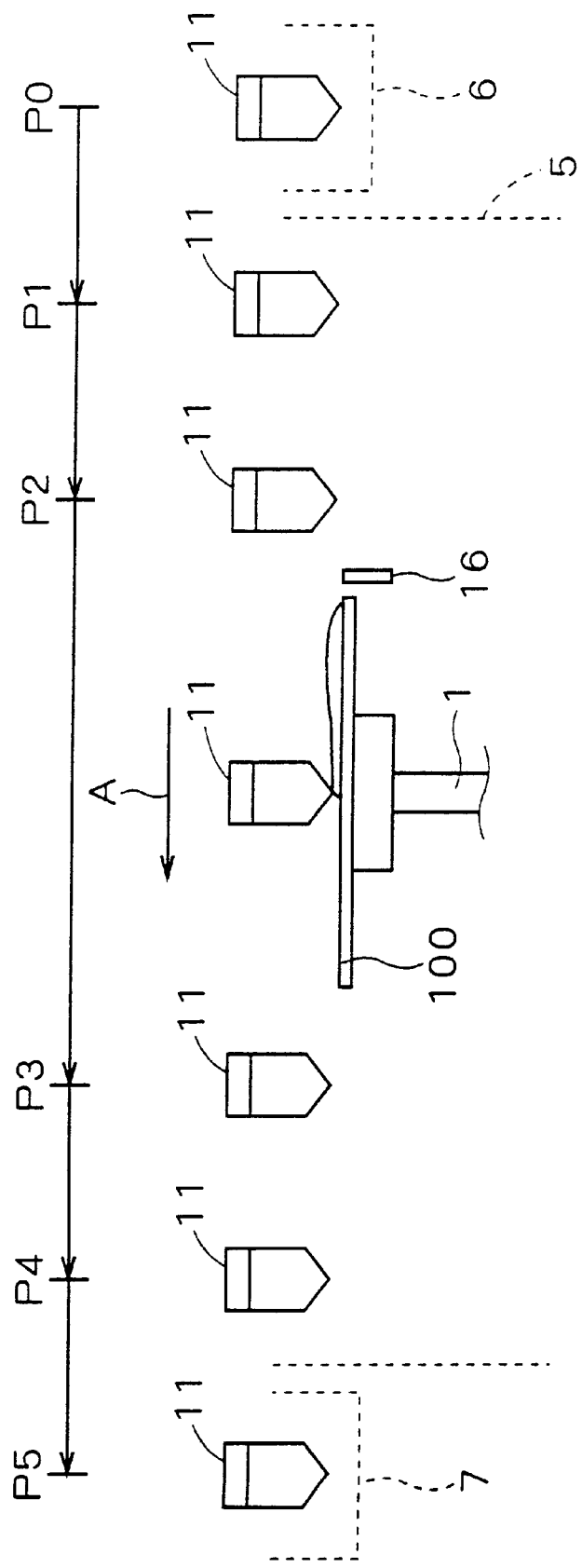
FIG. 12 is a view for describing an operation of the developing apparatus of FIG. 10.

Now, an operation of the developing apparatus shown in FIG. 10 will be described with reference to FIG. 12. FIG. 12 is an explanatory diagram for describing an operation of the developing apparatus of FIG. 10. The operation of the developing apparatus according to the second preferred embodiment is the same as that according to the first preferred embodiment described above until the stage where the developing solution dispensing nozzle 11 starts dispensing the developing solution with the predetermined flow rate at the dispensing start position P2.

While dispensing the developing solution, the developing solution dispensing nozzle 11 moves from the dispensing start position P2 toward a substrate 100 and passes above the solution removing member 16. At this stage, the solution removing member 16 removes the developing solution which adheres to the tip end of the developing solution dispensing nozzle 11 because of the surface tension. An operation for removing the developing solution will be described in detail later.

After moving past over the solution removing member 16, the developing solution dispensing nozzle 11 linearly moves over the substrate 100 in the scanning direction A while further dispensing the developing solution. As a result, the developing solution is uniformly supplied onto the entire surface of the substrate 100. The supplied developing solution is held on the substrate 100 due to the surface tension of the developing solution. The operation of the developing apparatus according to the second preferred embodiment is otherwise exactly the same as that of the developing apparatus according to the first preferred embodiment.

Next, the operation of the solution removing member 16 for removing the developing solution will be described further. As shown in FIG. 6B, as the developing solution dispensing nozzle 11 starts dispensing the developing solution, the developing solution which takes a form of a band at the slit-like dispensing opening 15. Meanwhile, the developing solution adheres to and stays at the slit-like dispensing opening 15 which is formed at the tip end of the developing solution dispensing nozzle 11 because of the surface tension. Further, at the start of dispensing of the developing solution, there is the developing solution with changed properties by contacting with air adhering in some cases. If the developing solution dispensing nozzle 11 moves to over the substrate 100 in such a condition, in addition to the developing solution which is dispensed from the developing solution dispensing nozzle 11, the adhering developing solution as well is supplied to the substrate 100. Hence, a quantity of the supply of the developing solution is too large, and therefore, during the initial operation section, the developing solution builds into an uneven film thickness or the developing solution with changed properties results in uneven development.

To deal with this, the solution removing member 16 removes the developing solution adhering to the tip end of the developing solution dispensing nozzle 11. In FIG. 13, the top edge portion 16a of the solution removing member 16 is located at such height which allows the top edge portion 16a to contact the developing solution which adheres to the tip end of the developing solution dispensing nozzle 11 without contacting the slit-like dispensing opening 15 of the developing solution dispensing nozzle 11. Hence, as the developing solution dispensing nozzle 11 passes above the solution removing member 16, the top edge portion 16a of the solution removing member 16 wipes off the developing solution which adheres to the tip end of the developing solution dispensing nozzle 11 so that the adhering developing solution is removed. The removed developing solution drops down on a wall surface of the solution removing member 16.

After moving past above the solution removing member 16, the developing solution dispensing nozzle 11 arrives at a substrate 100 while dispensing the developing solution. As a result, a small quantity of the developing solution adheres to the tip end of the developing solution dispensing nozzle 11 once again. However, by appropriately selecting the horizontal distance D between the solution removing member 16 and a substrate 100, it is possible to adjust the quantity of the developing solution which adheres to the tip end of the developing solution dispensing nozzle 11 again. Adherence of an appropriate quantity of the developing solution is advantageous to successively supply the developing solution onto a substrate 100 and prevent a local shortage of the supply.

Further, as the solution removing member 16 is formed in the form of an arc which matches an outer peripheral edge of a substrate 100, it is possible to maintain the horizontal distance D constant. This allows a traveling time from the solution removing member 16 to an edge of a substrate 100 to be approximately uniform entirely in the longitudinal direction of the tip end of the developing solution dispensing nozzle 11. As a result, the developing solution adheres uniformly to the tip end of the developing solution dispensing nozzle 11.

Figure 14:
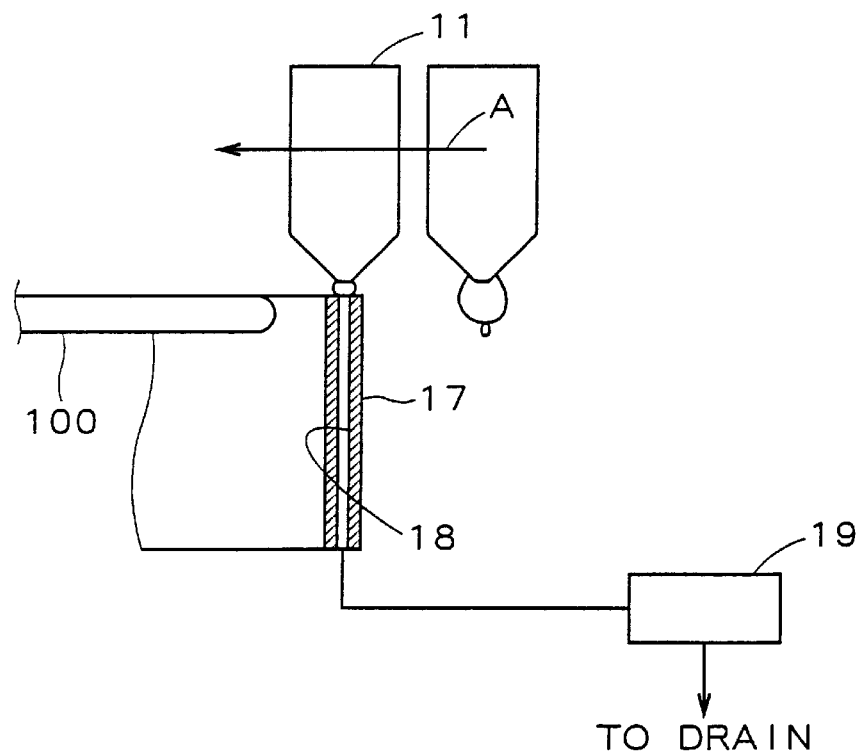
FIG. 14 is an explanatory diagram showing an operation of other example of the solution removing member.

FIG. 14 is an explanatory diagram showing an operation of other example of the solution removing member. A suction opening 18 for sucking in the developing solution is formed in a top surface of the illustrated solution removing member 17. The developing solution which is sucked in at the suction opening 18 passes through a pipe and discharged into a drain through an aspirator 19. Hence, when the developing solution dispensing nozzle 11 moves past above the solution removing member 17, the developing solution which adheres to the tip end of the developing solution dispensing nozzle 11 is sucked in at the suction opening 18 and removed. With such a structure, it is possible to remove the developing solution which adheres due to the surface tension from the tip end of the developing solution dispensing nozzle 11.

In the manner described above, it is possible to obtain similar effects to those according to the first preferred embodiment, except for the effect which is created by variable control of the scanning speed of the developing solution dispensing nozzle 11 or the flow rate from the developing solution dispensing nozzle 11.

Further, since the solution removing members 16, 17 are disposed off a substrate 100 toward the travel start position of the developing solution dispensing nozzle 11, after the developing solution which adheres to the tip end of the developing solution dispensing nozzle 11 is removed, the developing solution is supplied to a substrate 100. This avoids creation of development defects due to the developing solution with changed properties, and prevents an excessive supply of the developing solution during the initial scanning section for the developing solution dispensing nozzle 11 from causing uneven development and a deterioration in the uniformity of the linewidth of a pattern of a photosensitive film.

Although the predetermined embodiments described above are related to the structure that the solution removing members 16, 17 are formed in the form of an arc which matches an outer peripheral edge of a substrate 100, the solution removing members 16, 17 are not limited to such a shape. Instead, the solution removing members 16, 17 may be formed in a linear shape which is parallel to the longitudinal direction of the slit-like dispensing opening 15 of the developing solution dispensing nozzle 11. Alternatively, the solution removing members 16, 17 may be formed in any other shape with which the developing solution can be removed entirely over the width in the longitudinal direction the tip end of the developing solution dispensing nozzle 11.

While the invention has been described in detail, the foregoing description is in all aspects illustrative and not restrictive. It is understood that numerous other modifications and variations can be devised without departing from the scope of the invention.

We claim:

1. An apparatus for supplying a developing solution to a stationary substrate, comprising:

a) substrate holding means for holding a stationary substrate horizontally;

b) a developing solution dispensing nozzle for dispensing a developing solution onto said substrate;

c) moving means for moving said developing solution dispensing nozzle over said substrate which is held still by said substrate holding means, from a position on one side off said substrate to a position on the other side off said substrate; and d) control means for controlling a quantity of a supply of said developing solution from said developing solution dispensing nozzle onto said substrate to be constant per unit area over the entire substrate while said developing solution dispensing nozzle driven by said moving means passes over said substrate, said control means comprising speed control means which sets a travel speed of said developing solution dispensing nozzle at which said developing solution dispensing nozzle moves from a predetermined position on said substrate to an edge of said substrate on the other side to a first speed, and sets a travel speed of said developing solution dispensing nozzle at which said developing solution dispensing nozzle moves from an edge of said substrate on said one side to said predetermined position to a speed which is faster than said first speed.

2. An apparatus for supplying a developing solution to a stationary substrate comprising:

a) substrate holding means for holding a stationary substrate horizontally;

b) a developing solution dispensing nozzle for dispensing a developing solution onto said substrate;

c) moving means for moving said developing solution dispensing nozzle over said substrate which is held still by said substrate holding means, form a position on one side off said substrate to a position on the other side off said substrate; and d) control means for controlling a quantity of a supply of said developing solution from said developing solution dispensing nozzle onto said substrate to be constant per unit area over the entire substrate while said developing solution dispensing nozzle driven by said moving means passes over said substrate, said control means comprising speed control means which sets a travel speed of said developing solution dispensing nozzle at which said developing solution dispensing nozzle moves from an edge of said substrate on said one side to a predetermined position to a first speed, and sets a travel speed of said developing solution dispensing nozzle at which said developing solution dispensing nozzle moves from said predetermined position on said substrate to an edge of said substrate on the other side to a speed which is slower than said first speed.

3. The apparatus of claim 2, wherein said speed control means sets a travel speed of said developing solution dispensing nozzle at a rear edge portion of said substrate to a speed which is slower than said first speed.

4. An apparatus for supplying a developing solution to a stationary substrate, comprising:
   a) a substrate holding means for holding a stationary substrate horizontally;
   b) a developing solution dispensing nozzle for dispensing a developing solution onto said substrate;
   c) moving means for moving said developing solution dispensing nozzle over said substrate which is held still by said substrate holding means, from a position on one side off said substrate to a position on the other side off said substrate; and
   d) control means for controlling a quantity of a supply of said developing solution from said developing solution dispensing nozzle onto said substrate to be constant per unit area over the entire substrate while said developing solution dispensing nozzle driven by said moving means passes over said substrate, said control means comprising flow rate control means which sets a flow rate from said developing solution dispensing nozzle for dispensing from a predetermined position on said substrate to an edge of said substrate on the other side to a first flow rate, and sets a flow rate from said developing solution dispensing nozzle for dispensing from an edge of said substrate on said one side to said predetermined position to a flow rate which is smaller than said first flow rate.

5. An apparatus for supplying a developing solution to a stationary substrate comprising:
   a) substrate holding means for holding a stationary substrate horizontally;
   b) a developing solution dispensing nozzle for dispensing a developing solution onto said substrate;
   c) moving means for moving said developing solution dispensing nozzle over said substrate which is held still by said substrate holding means, from a position on one side off said substrate to a position on the other side off said substrate; and
   d) control means for controlling a quantity of a supply of said developing solution from said developing solution dispensing nozzle onto said substrate to be constant per unit area over the entire substrate while said developing solution dispensing nozzle driven by said moving means passes over said substrate, said control means comprising flow rate control means which sets a flow rate from said developing solution dispensing nozzle for dispensing from an edge of said substrate on said one side to a predetermined position on said substrate to a first flow rate, and sets a flow rate from said developing solution dispensing nozzle for dispensing from said predetermined position to an edge of said substrate on the other side to a flow rate which is larger than said first flow rate.

6. The apparatus of claim 5, wherein said flow rate control means sets a flow rate from said developing solution dispensing nozzle at a rear edge portion of said substrate to a flow rate which is larger than said first flow rate.

7. An apparatus for supplying a developing solution to a substrate, comprising:
   a) substrate holding means for holding a substrate horizontally;
   b) a developing solution dispensing nozzle for dispensing a developing solution onto said substrate;
   c) moving means for moving said developing solution dispensing nozzle over said substrate which is held still by said substrate holding means, from a travel start position off said substrate on one side to a travel end position off said substrate on the other side; and
   d) a solution removing member which is disposed between said travel start position and an edge of said substrate on said one side, said solution removing member removing said developing solution which adheres to a tip end of said developing solution dispensing nozzle.

8. The apparatus of claim 7, wherein said developing solution dispensing nozzle comprises a slit-like dispensing opening which is parallel to a surface of a substrate which is held by said substrate holding means, and
   said moving means moves said developing solution dispensing nozzle in a direction which is substantially perpendicular to a longitudinal direction of said slit-like dispensing opening.

9. The apparatus of claim 8, wherein said solution removing member comprises a top edge portion which contacts and removes said developing solution which adheres to a tip end of said developing solution dispensing nozzle.

10. The apparatus of claim 9, wherein said top edge portion is disposed equidistantly from an outer peripheral edge of said substrate.

11. The apparatus of claim 10, wherein said substrate is a circular substrate, and said top edge portion is formed in the form of an arc which matches an outer peripheral edge of said substrate.

12. The apparatus of claim 9, wherein said top edge portion is formed in a linear shape which is parallel to a longitudinal direction of said slit-like dispensing opening.

13. The apparatus of claim 8, wherein said solution removing member comprises a suction opening for sucking in said developing solution which adheres to a tip end of said developing solution dispensing nozzle.

14. The apparatus of claim 13, wherein said suction opening is disposed equidistantly from an outer peripheral edge of said substrate.

15. The apparatus of claim 14, wherein said substrate is a circular substrate, and said suction opening is formed in the form of an arc which matches an outer peripheral edge of said substrate.

16. The apparatus of claim 13, wherein said suction opening is formed in a linear shape which is parallel to a longitudinal direction of said slit-like dispensing opening.

* * * * *